(12) United States Patent
Kim et al.

(10) Patent No.: US 8,771,556 B2
(45) Date of Patent: Jul. 8, 2014

(54) SEMICONDUCTOR OXIDE INK COMPOSITION FOR INKJET PRINTING, METHOD OF MANUFACTURING THE SAME, AND METHOD OF MANUFACTURING PHOTOELECTRIC CONVERSION ELEMENT USING THE SAME

(75) Inventors: Won Jung Kim, Seoul (KR); Sang Hak Kim, Seoul (KR); Yong Jun Jang, Seongnam (KR); Yong Gu Kim, Hwaseong (KR); Mi Yeon Song, Seoul (KR); In Woo Song, Gyeonggi-Do (KR); Ki Chun Lee, Seoul (KR)

(73) Assignee: Hyundai Motor Company, Seoul (KR)

( * ) Notice: Subject to any disclaimer, the term of this patent is extended or adjusted under 35 U.S.C. 154(b) by 313 days.

(21) Appl. No.: 13/026,822

(22) Filed: Feb. 14, 2011

(65) Prior Publication Data

US 2012/0111409 A1    May 10, 2012

(30) Foreign Application Priority Data

Nov. 5, 2010    (KR) .................. 10-2010-0110063

(51) Int. Cl.
*H01B 1/20*    (2006.01)
*B05D 5/12*    (2006.01)

(52) U.S. Cl.
USPC .................. 252/519.5; 252/520.1; 252/520.2; 427/126.3

(58) Field of Classification Search
USPC .......................... 252/518.1–521.1; 427/126.3
See application file for complete search history.

(56) References Cited

U.S. PATENT DOCUMENTS

| 5,662,962 A * | 9/1997 | Kawata et al. ............. 427/126.2 |
| 6,645,582 B2 * | 11/2003 | Sadasivan et al. ......... 428/32.34 |
| 2005/0247915 A1 * | 11/2005 | Cnossen et al. ............... 252/500 |
| 2006/0284171 A1 | 12/2006 | Levy et al. |
| 2011/0127462 A1 * | 6/2011 | Choi et al. ................. 252/182.1 |
| 2011/0226321 A1 * | 9/2011 | Lee et al. ...................... 136/256 |

FOREIGN PATENT DOCUMENTS

| EP | 1936644 A2 | 6/2008 |
| JP | 2004-149765 A | 5/2004 |
| KR | 10-2008-0091241 | 10/2008 |
| KR | 10-2009-0012782 | 2/2009 |
| KR | 10-2010-0013197 | 2/2010 |

* cited by examiner

*Primary Examiner* — Mark Kopec
(74) *Attorney, Agent, or Firm* — Edwards Wildman Palmer LLP; Peter F. Corless (57) ABSTRACT

A semiconductor oxide ink composition, a method of manufacturing the composition, and a method of manufacturing a photoelectric conversion element are provided. The semiconductor oxide ink composition for inkjet printing comprises a semiconductor oxide and a solvent, wherein the semiconductor oxide comprises 0.1 to 20 parts by weight relative to 100 parts by weight of the total composition.

17 Claims, 8 Drawing Sheets

SEMICONDUCTOR OXIDE INK COMPOSITION FOR INKJET PRINTING, METHOD OF MANUFACTURING THE SAME, AND METHOD OF MANUFACTURING PHOTOELECTRIC CONVERSION ELEMENT USING THE SAME

CROSS-REFERENCE TO RELATED APPLICATION

This application claims under 35 U.S.C. §119(a) the benefit of Korean Patent Application No. 10-2010-0110063 filed Nov. 5, 2010, the entire contents of which are incorporated herein by reference.

BACKGROUND (a) Technical Field

The present invention relates to a semiconductor oxide ink composition for inkjet printing, a method of manufacturing the same, and a method of manufacturing a photoelectric conversion element using the same. In particular, the present invention relates to a semiconductor oxide ink composition appropriate for inkjet printing which helps to effectively produce a photoelectric conversion element, such as a curved dye-sensitized solar cell, a method of manufacturing the semiconductor oxide ink composition, and a method of manufacturing a photoelectric conversion element using the semiconductor oxide ink composition.

(b) Background Art

Recently, the growing interest in environmentally friendly energy has led to intensive research on photoelectric conversion elements such as solar cells. Among them, dye-sensitized solar cells are known to be suitable for building integrated photovoltaics (BIPV) because they can be installed along the curvaceous surface of a building while retaining their visual advantages such as beautiful color tones and translucent characteristics.

Many high-efficiency hybrid electric vehicles ("HEVs") are provided with a sunroof with a silicon solar cell panel on the top. However, this type of sunroof is opaque and, thus, loses its originally intended attractiveness of openness. Accordingly, there has been a need for the development of sunroofs for vehicles having dye-sensitized solar cells which possess both transparency and an aerodynamically curved design.

A basic structure of a dye-sensitized solar cell includes a working electrode and a counter electrode joined to the working electrode. Dye, a semiconductor oxide, and an electrolyte are injected in between the working electrode and the counter electrode. The dye absorbs light to emit electrons. The semiconductor oxide has porous nano-particles which transport the emitted electrons to an external electrode. The electrolyte releases electrons to make up for the emitted electrons. The oxidized electrolyte may be reduced by the counter electrode.

Figure 1:
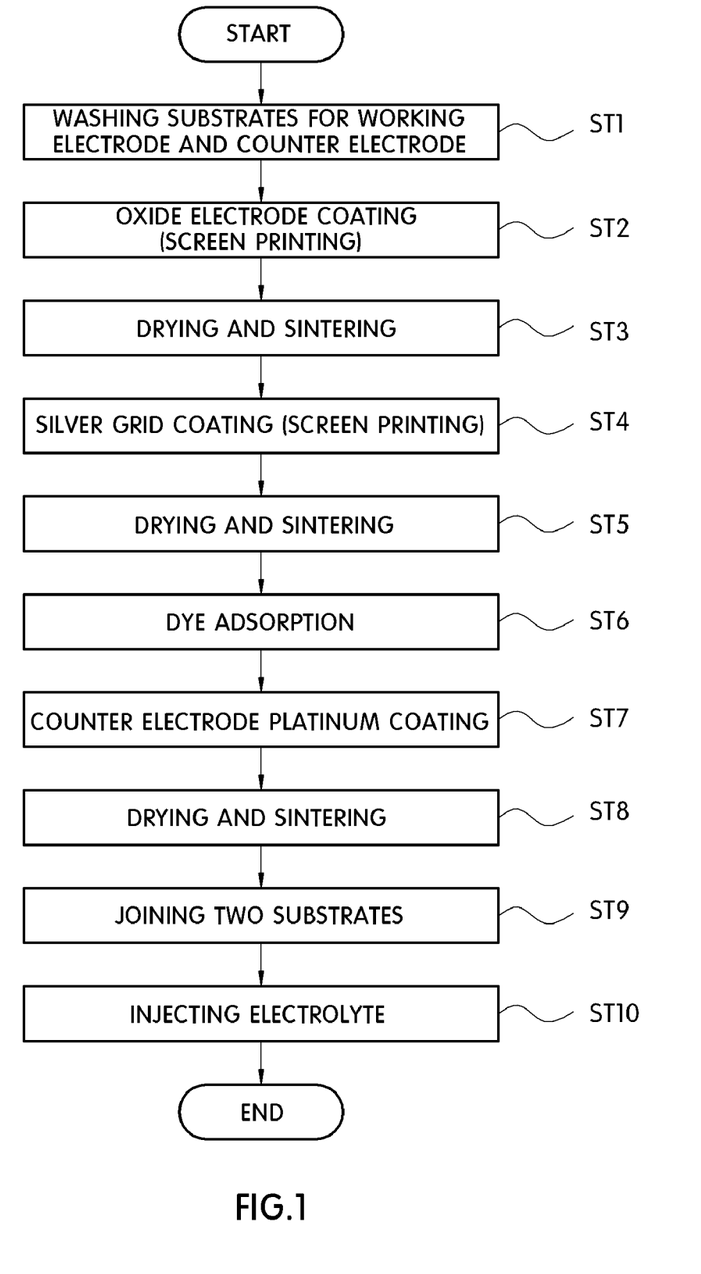
FIG. 1 is a flowchart illustrating a process of manufacturing a conventional planar dye-sensitized solar cell.

A basic method of manufacturing a dye-sensitized solar cell will be descried with reference to FIG. 1.

First, a conductive substrate coated with a transparent electrode (transparent conductive layer), such as ITO (Indium doped Tin Oxide) or FTO (Fluorine doped Tin Oxide), which is used as a working electrode, is washed (ST1).

A semiconductor oxide electrode made of $TiO_2$, ZnO, $SnO_2$, or $Nb_2O_5$ is then coated on the washed conductive substrate using a screen printing method (ST2), and is subsequently dried and sintered (ST3). In general, a dye-sensitized solar cell exhibits an excellent efficiency when employing $TiO_2$ nano-particles. The coating and sintering are repeated until a desired thickness is achieved.

In the case of a large-area dye sensitized solar cell, a silver grid may be used to raise efficiency (ST4). This step is generally not carried out for a unit cell sized dye sensitized solar cell. Like the semiconductor oxide electrode, the silver grid is subjected to screen printing, drying, and sintering (ST5). The thus treated silver grid is then soaked in a dye for a suitable period of time (for example, for about 24 hrs) so that the dye may be adsorbed thereon, thereby completing the working electrode (ST6).

Next, a conductive substrate coated with a transparent electrode, which is used as a counter electrode, is washed. Platinum is coated on the washed conductive substrate (ST7), followed by drying and sintering (ST8). As described above in connection with the working electrode, a silver grid may be included for a large-area dye-sensitized solar cell to raise efficiency.

The thus manufactured two electrodes (working electrode and counter electrode) are joined together by an organic or inorganic material having adhesive characteristics, such as Surlyn™, epoxy, or glass frit (ST9). An electrolyte is further injected between the two electrodes, thus completing the formation of the dye-sensitized solar cell (ST10).

In the manufacturing process, the sintering steps may be performed at a suitable temperature, for example at a temperature of 400° C. to 800° C., for a suitable time, for example for 5 min to 2 hrs, or longer.

As described above, a general dye-sensitized solar cell is produced by coating various constitutional materials on a planar substrate via a screen printing method.

In order to prepare a desired pattern on a conductive substrate using a screen printing method, a paste is pressingly pushed into the openings of a screen with a dense mesh made of plastic or metal fiber. The substrate, is brought into contact with the openings of the screen, and a predetermined pressure is applied by a squeegee to form a coating layer on the substrate. In performing the screen printing method, it is essential to repeat the drying and sintering processes on a coating layer at least 3-6 times to prevent any damage that might occur during the subsequent screen printing step. As a result, the manufacturing process becomes more complex and the production cost increases.

Moreover, if the dye-sensitized solar cell is manufactured using a curved substrate in the screen printing method, it may lead to a difference in thickness of the coating layer along the substrate surface, such as between the central portion and both ends of the substrate. Further, if the coating process is performed at an increased squeegee pressure in an attempt to prevent such a thickness difference, the mesh may become damaged when fixed under a constant tension. Accordingly, it is difficult to apply the screen printing method to a curved substrate.

Thus, it is necessary to use other processes to manufacture a curved dye-sensitized solar cell, such as a curved dye-sensitized solar cell with two different curvatures of R1 and R2.

In recent years, as technologies for LCDs or OLEDs have been developed, an inkjet printing method used for manufacturing displays or semiconductors has been receiving increased attention because the inkjet printing method is a contactless coating method, and is capable of performing swift coating on a complicated pattern.

However, the inkjet printing method may not be employed for a process of forming a layer with thickness 1 µm or larger, such as a semiconductor oxide layer used for a dye-sensitized solar cell. To apply the inkjet printing method for the formation of a layer having a thickness of 1 µm or higher, it is essential to develop a suitable semiconductor oxide ink composition.

Further, there is no common process to manufacture a dye-sensitized solar cell using the inkjet printing method. Therefore, there is a need for the development of an ink composition capable of forming a semiconductor oxide layer for a dye-sensitized solar cell, and a method of manufacturing a dye-sensitized solar cell using the inkjet printing method.

SUMMARY OF THE DISCLOSURE

The present invention provides a semiconductor oxide ink composition and a method of manufacturing the composition that allows for formation of a semiconductor oxide layer with a thickness of above 1 µm. the present invention further provides a method of manufacturing a photoelectric conversion element including a curved dye-sensitized solar cell using the semiconductor oxide ink composition.

According to an embodiment of the present invention, there is provided a semiconductor oxide ink composition for inkjet printing comprising a semiconductor oxide and a solvent. The semiconductor oxide is provided in suitable amounts, and in accordance with various aspects of the invention, the semiconductor oxide is included at about 0.1 to 20 parts by weight relative to 100 parts by weight of the total composition.

The semiconductor oxide may be selected from any known semiconductor oxides, and in some embodiments may be selected from $TiO_2$, $ZnO$, $SnO_2$, $Nb_2O_5$ and mixtures thereof.

The solvent may be any known solvent suitable for such ink compositions, and in some embodiments is selected from the group consisting of water, methanol, ethanol, n-propyl alcohol, isopropyl alcohol, normal butanol, isobutanol, hexanol, ethylene glycol, glycerol, 2-methoxyethanol, 2-butoxyethanol, 2-ethoxyethanol, nitromethane, ethylacetate, dimethylformamide, methylethylketone, N-methyl-2-pyrolidone, 2-pyrolidone, N-vinyl-2-pyrolidone, dimethylsulfoxide, n-butyrolactone, γ-butyrolactone, α-terpineol, xylene, chloroform, toluene, hexane, cycle hexane, tetrahydrofuran, and acetone, or a mixture thereof.

The composition may further include a first agent selected from a silane coupling agent, a chelate agent, or a mixture thereof. According to various embodiments, such agents can be provided for surface modification of the semiconductor oxide particles. In some embodiments, the first agent can be included in amounts ranging from about 0.01 to 50 parts by weight relative to 100 parts by weight of the total composition, and in some embodiments the first agent is provided in an amount suitable for surface modification of the semiconductor particles.

The composition may further comprise a second agent selected from the group consisting of ethylene oxide-based compounds, Pluronic series commercially available from BASF corporation, DisperBYK series commercially available from BYK corporation, mehtyl-β-cycoldextrin, cetyltrimethylammonium bromide (CTAB), sodium dodecylsulfonate (SDS), polystyrene sulfonate (PSSA), poly(sodium-4-stylenesulfonate) (PSSNa), dodecylbenzene sulfonate (DBSA), acetylacetone, cellulose-based compounds, and acrylate-based compounds, or a mixture thereof. Such agents can be included so as to enhance dispersability and adhesion with a substrate. In some embodiments, the second agent can be provided at a weight ratio of 0.5 to 300 wt % relative to the content of the semiconductor oxide, and in some embodiments the second agent is provided in an amount suitable to enhance dispersability and adhesion with a substrate.

The composition may further comprise a viscosity controlling agent. Any known viscosity controlling agents can suitable used and, in some embodiments, are selected from the group consisting of alginic acid, arabic gum, polyvinylalcohol (PVA), curdlan, gelatin, guar gum, glucomannan, locust bean gum, pectin, tamarind gum, xanthan gum, polyvinylpyrrolidone, ethylcellulose, and methylcellulose.

According to various aspects, the semiconductor oxide has an average secondary particle size that is no greater than about 1 µm. The semiconductor oxide ink composition is provided with suitable viscosities and surface tensions, and in some embodiments, is provided with viscosity of about 1 to 30 cp, and a surface tension of about 20 to 70 dynes/cm.

According to an embodiment of the present invention, there is provided a method of manufacturing a semiconductor oxide ink composition for inkjet printing using 0.1 to 20 parts by weight of a semiconductor oxide relative to 100 parts by weight of the total composition comprising the semiconductor oxide and a solvent.

In embodiments wherein the semiconductor oxide may be used in the form of a sol, about 0.5 to 90 parts by weight of the semiconductor oxide may be used relative to 100 parts by weight of the total composition.

The total solution can be dispersed using any suitable means, such as a ball mill, a bead mill, and an ultrasonic homogenizer, for further surface modification of the semiconductor oxide.

According to an embodiment of the present invention, there is provided a method of manufacturing a photoelectric conversion element including preparing the semiconductor oxide ink composition manufactured above or preparing a semiconductor oxide ink composition using the above-described method; applying, and in particular jetting, the semiconductor oxide ink composition and the metallic ink composition on a first conductive substrate, particularly in an inkjet printing method, to form a semiconductor oxide layer and a metallic grid, respectively, thereby completing a working electrode; applying, and in particular jetting, the metallic ink composition on a second conductive substrate, particularly in an inkjet printing method, to form a catalyst electrode, thereby completing a counter electrode; and drying and sintering the semiconductor oxide layer, the metallic grid, and the catalyst electrode.

According to embodiments of the invention, the first and second conductive substrates may be planar or curved.

According to the present invention, the thickness of the semiconductor oxide layer may vary, and in some embodiments is greater than or equal to about 1 µm. Preferably, the semiconductor oxide layer may be formed by laminating two or more of semiconductor oxide ink by means of an alternative coating on the conductive substrates.

According to embodiments of the present invention, a semiconductor oxide layer for a photoelectric conversion element may be formed using the inkjet printing method. A photoelectric conversion element including a curved dye-sensitized solar cell may be manufactured using the semiconductor oxide layer. Because the inkjet printing method is a contactless printing method, it can provide a reduction in manufacturing processes and costs. Further, the inkjet printing method provides for hardly any waste of materials because it is capable of laminating a material on a desired patterning position.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle has two or more kinds of power sources, for example, a gasoline and electricity.

BRIEF DESCRIPTION OF THE DRAWINGS

Exemplary embodiments of the present invention will now be described in detail with reference to certain exemplary embodiments thereof illustrated the accompanying drawings which are given hereinbelow by way of illustration only, and thus are not limitative of the present invention, and wherein.

DETAILED DESCRIPTION

The terms and phrases used herein are used to describe exemplary embodiments of the present invention without intending to limit the present invention thereto.

According to an embodiment, the present invention provides a semiconductor oxide ink composition using a semiconductor oxide sol, semiconductor oxide nano-particles, or a semiconductor oxide nano-wire made of a suitable oxide material, particularly for example $TiO_2$, $ZnO$, $SnO_2$, $Nb_2O_5$ or a mixture thereof. The semiconductor oxide ink composition of the present invention has an excellent dispersability and viscosity, particularly considering a mean size of secondary particles. Excellent surface tension is further provided by the present composition, particularly when the surface of the semiconductor oxide particles are modified using an acid material or chelate reagent, and further when properly mixing the semiconductor oxide with a dispersing agent and a solvent.

According to an embodiment of the present invention, a process of manufacturing a photoelectric conversion element including a curved dye-sensitized solar cell is provided wherein the process includes using the semiconductor oxide ink composition. According to aspects of the invention, the process may form a layer having a thickness of 1 µm or higher. Processes of the present invention can provide reduction of manufacturing time and cost.

An embodiment of the present invention may include the steps of forming a semiconductor oxide sol or nano-particles, forming a semiconductor oxide ink composition suitable for inkjet printing, and forming a curved dye-sensitized solar cell using the semiconductor oxide ink composition in an inkjet printing method.

Although certain embodiments of the present invention are described herein in connection with a semiconductor oxide ink composition formed using $TiO_2$, a method of manufacturing the semiconductor oxide ink composition which is formed using $TiO_2$, and a method of manufacturing a dye-sensitized solar cell using the semiconductor oxide ink composition which is formed using $TiO_2$, the present invention is not limited thereto. According to come embodiments embodiment, the present invention may be applied to any photoelectric conversion element requiring the formation of a thick semiconductor oxide layer, for example a semiconductor oxide layer having a thickness of about 1 µm or higher.

Hereinafter, steps of the present invention will be described in greater detail.

Step 1

In this step, a process of synthesizing $TiO_2$ used herein and a process of manufacturing a $TiO_2$ ink composition appropriate for inkjet printing according to an embodiment will be described. The $TiO_2$ synthesizing process may be omitted in the case of using commercially available $TiO_2$ particles, $TiO_2$ dispersing solution, or $TiO_2$ paste. The solution-type $TiO_2$ may be used after removal of the solvent included therein.

For reference, the process of synthesizing $TiO_2$ nano-particles used herein is similar to that disclosed in, for example, Korean Patent Application Publication Nos. 2001-38061 and 2001-23137.

First, a precursor such as titanium isopropoxide, titanium isobutoxide, or titanium tetrachloride and any one or a mixture of two or more selected from water, methanol, ethanol, n-propyl alcohol, isopropyl alcohol, normal butanol, isobutanol, hexanol, ethylene glycol, glycerol, 2-methoxy ethanol, 2-butoxy ethanol, and 2-ethoxy ethanol are mixed at a temperature of −30° C. to 30° C. at a mole ratio of 1:15 to 1:30 to prepare a mixed solvent.

The mixed solvent is mixed with any one or a mixture of two or more selected from nitric acid, sulfuric acid, hydrochloric acid, and hydrofluoric acid at a mole ratio 1:0.05 to 1:1 respective of the precursor, and added with any one or a mixture of two or more selected from silane coupling agents including 3-methacryloxypropyltrimethoxysilane, vinyltrimethoxysilane, N-2-(aminoethyl)-3-aminopropyltriethoxysilane, and triethylvinylsilane or agents including citric acid, acetic acid, 4-hydroxybenzoic acid, poly(4-styrenesulfonic acid), sodium dodecylsulfonate, toluenesulfonic acid, methanesulfonic acid, pyridinum toluenesulfonate, camphorsulfonic acid, benzenesulfonic acid, sulfosalicylic acid, 2-naphthalene sulfonic acid, anthraquinone sulfonic acid, oxalic acid, gluconic acid, phosphonic acid, ethylenediaminetetraacetic acid, ethyl acetoacetate, 2,3-butanedione, diacetone alcohol, isopropyl chloroacetate, iron nitrate, iron chloride, triethyl phosphate, octyl ether, and acetylacetone, at a mole ratio of 1:0.01 to 1:0.5 respective of the precursor so as to modify the particle surface of $TiO_2$ (semiconductor oxide) to be synthesized later.

Then, the thus formed mixture is stirred at a temperature of room temperature to 200° C. for 1 hr to 24 hrs to thereby form a $TiO_2$ sol.

After the completion of the stirring process, the solvent is partially removed using a rotary evaporator to form a $TiO_2$ sol, or the mixture is repeatedly added and washed with water or ethanol several times to adjust its pH to 7. The solvent is then removed from the $TiO_2$ sol to thereby obtain $TiO_2$ nano-particles.

It can be seen from an XRD result obtained after sintering the $TiO_2$ sol or nano-particles that the thus formed $TiO_2$ sol or nano-particles are mostly anatase.

Step 2

In this step, a process is described for manufacturing a semiconductor oxide ink composition appropriate for inkjet printing having improved dispersability viscosity, considering a mean size of secondary particles, ν and surface tension using the $TiO_2$ sol or nano-particles formed in the first step or commercially available $TiO_2$ particles, $TiO_2$ dispersing agent, or $TiO_2$ paste.

The amount (or content) of $TiO_2$ sol or nano-particles used is not limited to a specific value. For example, 0.5 to 90 parts by weight of $TiO_2$ sol or 0.1 to 20 parts by weight of $TiO_2$ nano-particles may be used relative to 100 parts by weight of the total solution (specifically, the semiconductor oxide ink solution).

The solvent used may be any one or a mixture of two or more selected from, for example, water, methanol, ethanol, n-propyl alcohol, isopropyl alcohol, normal butanol, isobutanol, hexanol, ethylene glycol, glycerol, 2-methoxyethanol, 2-butoxyethanol, 2-ethoxyethanol, nitromethane, ethylacetate, dimethylformamide, methylethylketone, N-methyl-2-pyrolidone, 2-pyrolidone, N-vinyl-2-pyrolidone, dimethylsulfoxide, n-butyrolactone, γ-butyrolactone, α-terpineol, xylene, chloroform, toluene, hexane, cycle hexane, tetrahydrofuran, and acetone.

To further modify the surface of the $TiO_2$ sol or nano-particles, a suitable amount, such as about 0.01 to 50 parts by weight, of any one or a mixture of two or more selected from silane coupling agents including 3-methacryloxypropyltrimethoxysilane, vinyltrimethoxysilane, N-2-(aminoethyl)-3-aminopropyltriethoxysilane, and triethylvinylsilane, and chelate agents including citric acid, acetic acid, 4-hydroxybenzoic acid, poly(4-styrenesulfonic acid), sodium dodecylsulfonate, toluenesulfonic acid, methanesulfonic acid, pyridinum toluenesulfonate, camphorsulfonic acid, benzenesulfonic acid, sulfosalicylic acid, 2-naphthalene sulfonic acid, anthraquinone sulfonic acid, oxalic acid, lauric acid, gluconic acid, phosphonic acid, ethylenediaminetetraacetic acid, ethyl acetoacetate, 2,3-butanedione, diacetone alcohol, isopropyl chloroacetate, iron nitrate, iron chloride, triethyl phosphate, and octyl ether, may be mixed with 100 parts by weight of the total solution and stirred at a temperature of room temperature to 120° C. in a nitrogen or ambient atmosphere for 0.1 to 12 hrs.

In some embodiments, a dispersing machine, such as a ball mill, a bead mill, or a high-pressure homogenizer, may be used.

If the amount of agent added to further modify the $TiO_2$ sol or nano-particles is less than 0.01 parts by weight, then a surface modification effect may be insufficient. On the other hand, if the amount of agent is in excess of 50 parts by weight, then the agent, if the agent is a solid state agent, may not be easily soluble in water.

According to an embodiment, to enhance dispersability and adhesion with a substrate, any one or a mixture of two or more materials selected from an ethylene oxide-based compound, or a poly ethylene oxide-based compound such as triton X-100 and triton X-200, and a mixed copolymer, with random or alternative arrangement of polyethylene oxide and polypropylene oxide such as Pluronic series (P123, F127, F68, L64) as commercially available from BASF corporation, DisperBYK series commercially available from BYK corporation (for example, DisperBYK-106, DisperBYK-111, DisperBYK-180, DisperBYK-2001), mehtyl-6-cycoldextrin, cetyltrimethylammonium bromide (CTAB), sodium dodecylsulfonate (SDS), polystyrene sulfonate (PSSA), poly(sodium-4-stylenesulfonate) (PSSNa), dodecylbenzene sulfonate (DBSA), acetylacetone, a cellulose-based compound such as methyl cellulose, ethyl cellulose, 2-hydroxyethyl cellulose, sulfoxyethyl cellulose, and hydroxybutyl methyl cellulose, and an acrylate-based compound such as polyvinylpyrrolidone, polypropylene glycol acrylate, polypropylene glycol diacrylate, and polypropylene glycol dimethylacrylate may be added. Preferably, the material(s) is/are added at a weight ratio of about 0.5 to 300% relative to the overall content of the $TiO_2$ sol or nano-particles.

If the amount of the added agent is less than 0.5% relative to the weight of the $TiO_2$ sol or nano-particles, a dispersing effect may be insufficient. On the other hand, if the amount of the added agent is in excess of 300%, the agent may serve as impurities.

According to an embodiment, one or more viscosity controlling agents can further be added to control viscosity the semiconductor oxide ink composition manufactured in the above method. Such viscosity controlling agents can be any such known agents and can be selected from, but not limited to, for example alginic acid, arabic gum, polyvinylalcohol (PVA), curdlan, gelatin, guar gum, glucomannan, locust bean gum, pectin, tamarind gum, xanthan gum, polyvinylpyrrolidone, ethylcellulose, and methylcellulose. According to an embodiment, a process such as by a 3-roll mill may also be used to control viscosity.

As described above, a semiconductor oxide sol or nano-particles formed of $TiO_2$, $ZnO$, $SnO_2$ or a mixture thereof is synthesized, the surface is modified by using an acidic material or chelate reagent, and the semiconductor oxide sol or nano-particles are mixed with a dispersing agent to enhance dispersability and with a solvent suitable for inkjet printing, thus manufacturing a semiconductor oxide ink composition for inkjet printing.

The semiconductor oxide used herein is not limited to any specific type. For example, spherical-, acicular-, or wire-type semiconductor oxides may be used.

In an embodiment, a $TiO_2$ solution or paste previously dispersed in a solvent as well as the directly synthesized $TiO_2$ may also be used.

Although the described embodiment has been described, in particular, in connection with the synthesis of a $TiO_2$ sol for manufacturing the semiconductor oxide ink composition, the present invention is not limited thereto. For example, the semiconductor oxide ink composition according to an embodiment may be manufactured by synthesizing a semiconductor oxide sol such as a ZnO sol or $SnO_2$ sol. According to an embodiment, the semiconductor oxide may be selected from $TiO_2$, $ZnO$, $SnO_2$, $Nb_2O_5$ or a mixture thereof. For example, the semiconductor oxide layer may be formed by coating a mixed semiconductor oxide ink of $TiO_2$ and ZnO on the conductive substrates. According to an embodiment, a process of synthesizing the ZnO sol or $SnO_2$ sol may be substantially identical to the process of synthesizing the $TiO_2$ sol except that $ZnCl_2$ or $SnCl_4$ is used as a precursor.

As described above, the used solvent may be any one or a mixture of two or more solvents. For example, the solvent(s) may be selected from ethylene glycol and/or α-terpineol which can beneficially prevent nozzle clogging due to evaporation of the solvent during the inkjet printing. One or more alcohols, such as ethanol or isopropyl alcohol, can also be used which can beneficially enhance wettability on the surface of the glass substrate.

The present $TiO_2$ ink composition for jet printing may satisfy three basic characteristics. For example, the average secondary particle size of $TiO_2$ included in the manufactured semiconductor oxide ink composition may be smaller than 1 μm. According to an embodiment, the average secondary particle size may be equal to or smaller than 200 nanometers.

If the average secondary particle size of $TiO_2$ is greater than 1 μm, the nozzle of the inkjet printer may be clogged and thus make the printing work difficult.

In general, $TiO_2$ particles, each of which has a primary particle size of a few nanometers to a few tens of nanometers, are agglomerated to form a cluster of $TiO_2$ particles upon manufacturing the ink composition. The "secondary particle size" used herein refers to a size of the cluster of $TiO_2$ particles formed when the ink composition is manufactured.

According to an embodiment, the viscosity of the semiconductor oxide ink composition may be in a range of from about 1 to 30 cp. When the viscosity is less than 1 cp, it may be difficult to obtain uniform liquid droplets, thus making it difficult to form uniform coating. On the other hand, if the viscosity is more than 30 cp, the jet speed is decreased or the ink composition may be difficult to jet. In certain embodiments, the viscosity may be reduced by heating the ink composition, but it may be useful in performing processes.

According to some embodiments of the present invention, the surface tension of the semiconductor oxide ink composition may be in a range from about 20 to 70 dynes/cm. When the surface tension is less than 20 dynes/cm, a meniscus may be formed under the surface of the nozzle of the inkjet printer and ink sludge may be created. On the other hand, if the surface tension is greater than 70 dynes/cm, the ink composition may be more resistant to detachment from the nozzle when being jetted from the nozzle, thereby leading to a lowering in jet speed.

Step 3

In this step, a method of manufacturing a dye-sensitized solar cell is described that includes forming a semiconductor oxide layer on a substrate with two different curvatures R1 and R2 (for example, curvatures measured in horizontal and vertical directions) in an inkjet printing process using the $TiO_2$ ink composition for inkjet printing manufactured in the second step.

In this embodiment, among various inkjet printing methods, a drop-on-demand ("DOD") type printing method is used that may jet the ink composition in response to an electrical signal only when it is required, thus saving ink composition. However, the present invention is not limited thereto. According to other embodiments, various other continuous jet or electrostatic inkjet types of processes may be employed.

According to an embodiment, a conductive substrate with the same curvatures R1 and R2 as those of a sunroof of a vehicle may be used.

Figure 2:
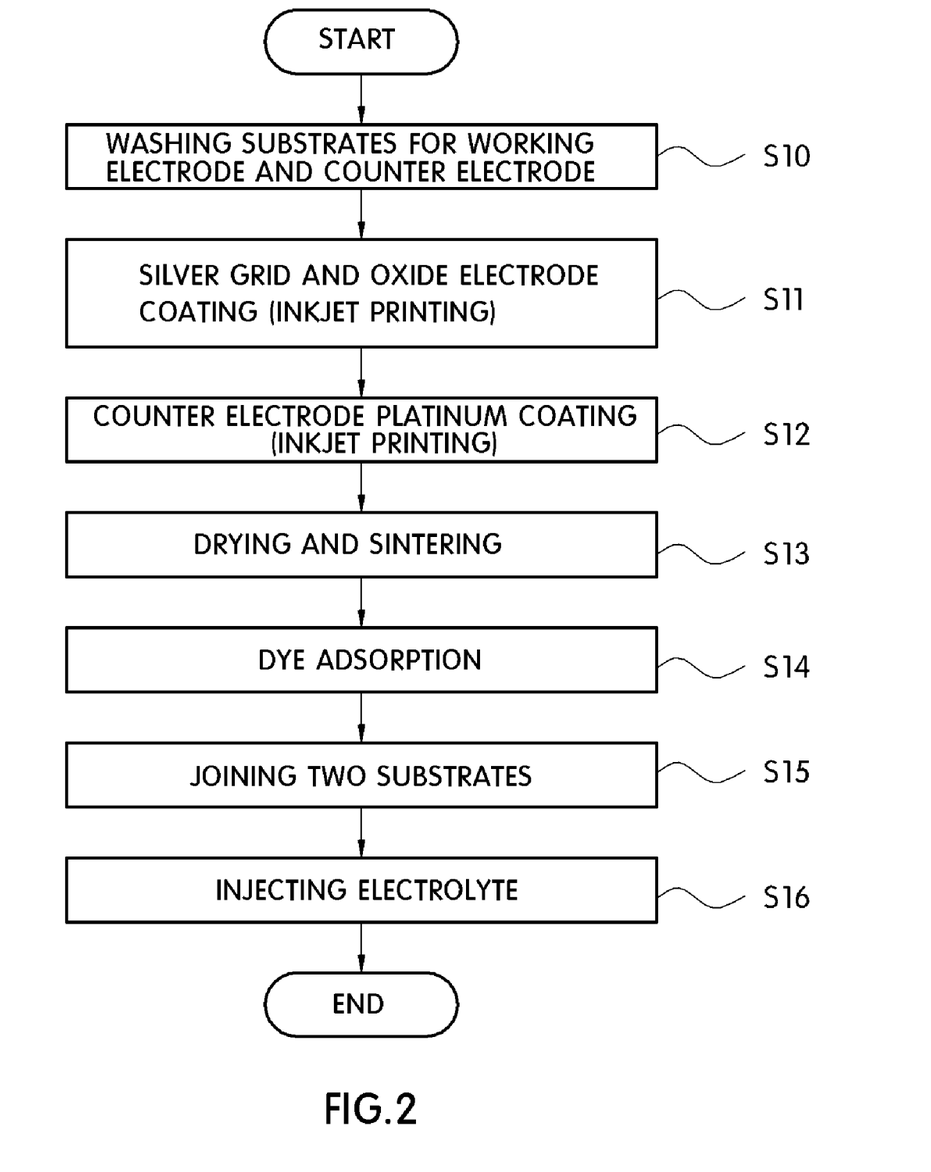
FIG. 2 is a flowchart illustrating a process of manufacturing a curved dye-sensitized solar cell using an inkjet printing method according to an embodiment of the present invention.
Figure 3:
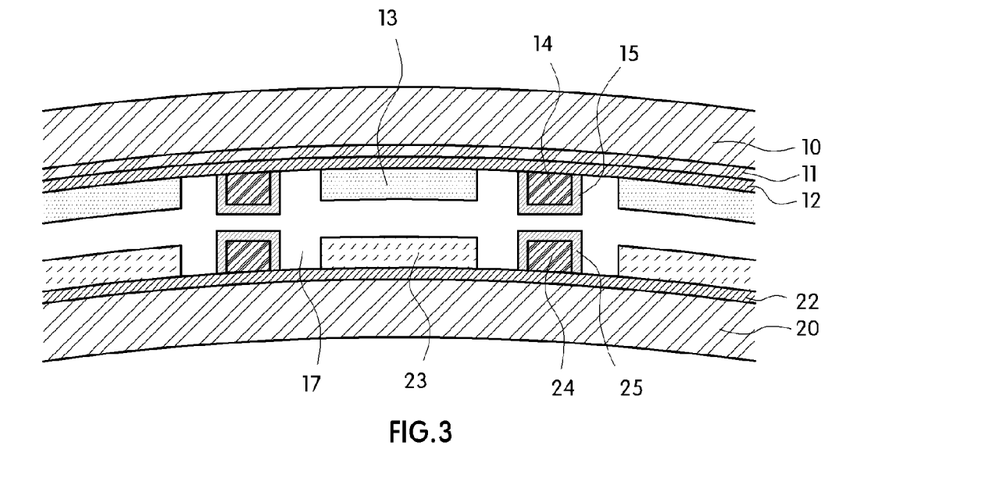
FIG. 3 is a view illustrating a curved dye-sensitized solar cell manufactured according to an embodiment of the present invention.

To manufacture a dye-sensitized solar cell module, two FTO-coated curved substrates 10 and 20 are washed and prepared (S10). The $TiO_2$ ink composition manufactured in the second step, a silver ink composition, and a Pt ink composition are injected in different inkjet heads, respectively. Then, the $TiO_2$ ink composition and silver ink composition are jetted on the curved substrate 10 along predetermined pattern programs to form a working electrode (S11).

According to various embodiments, the silver ink composition and Pt ink composition may be produced according to the same process as that of the $TiO_2$ ink composition except for using silver and platinum, respectively, instead of $TiO_2$.

Subsequently, the Pt ink composition is jetted on the other curved substrate 20 (S12) and sintered at a temperature of 400 to 500° C. (S13) to form a counter electrode.

Figure 4:
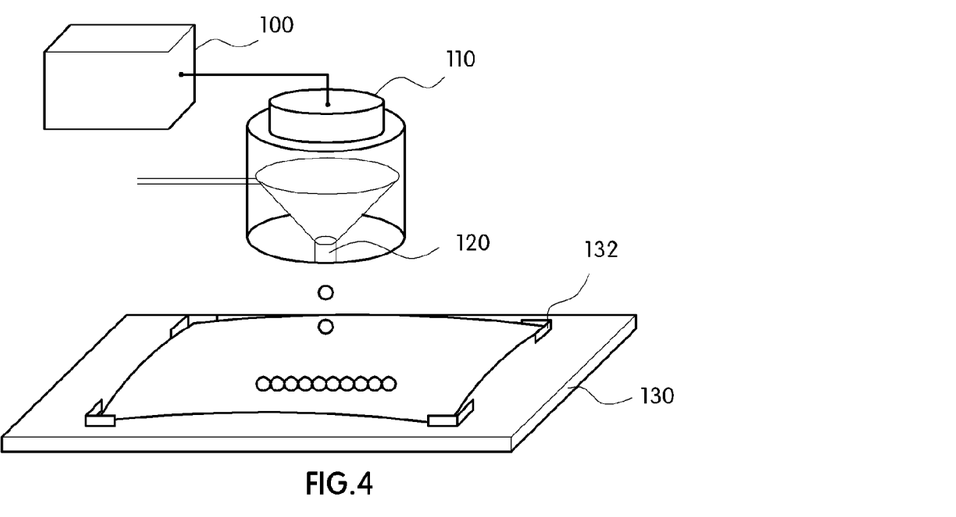
FIG. 4 is a view schematically illustrating an inkjet printer having a support with a holder for supporting a curved substrate according to an embodiment of the present invention.
Figure 5:
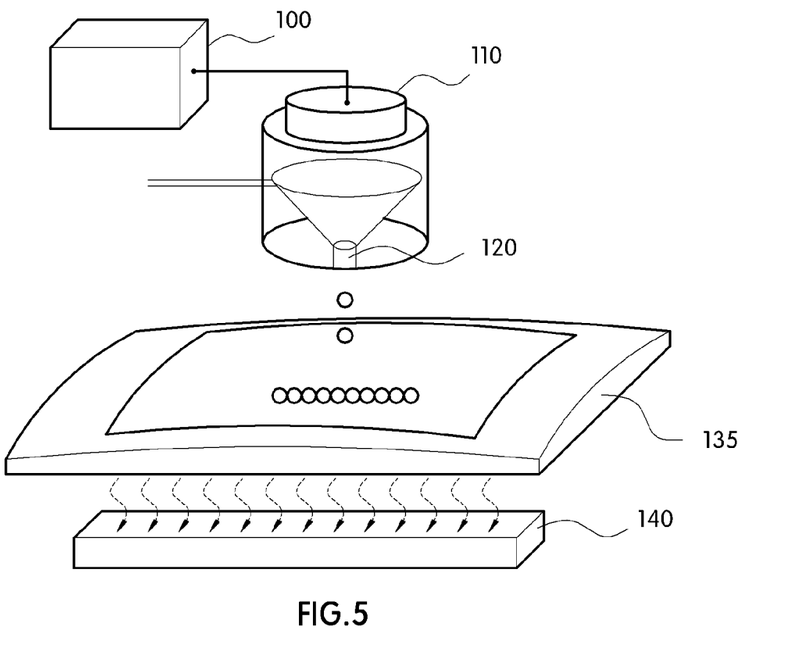
FIG. 5 is a view schematically illustrating an inkjet printer having a support with a holder whose curvature is identical to that of a curved substrate according to an embodiment of the present invention.
Figure 6:
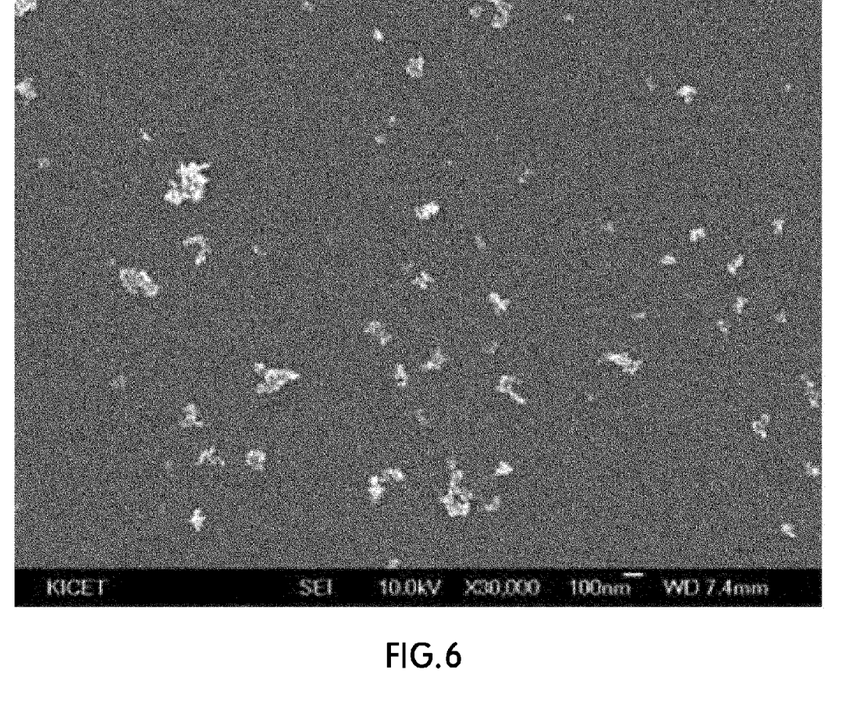
FIG. 6 is a view illustrating a size of a $TiO_2$ particle included in a $TiO_2$ ink composition manufactured according to an embodiment of the present invention.
Figure 7:
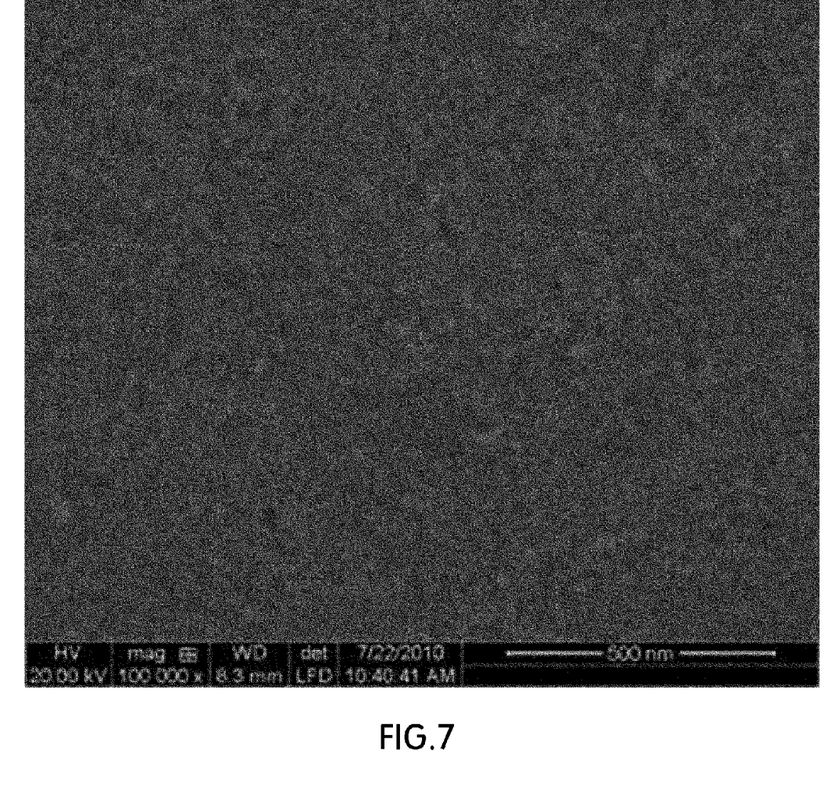
FIG. 7 is a view illustrating a surface of a $TiO_2$ layer formed according to an embodiment of the present invention.
Figure 8:
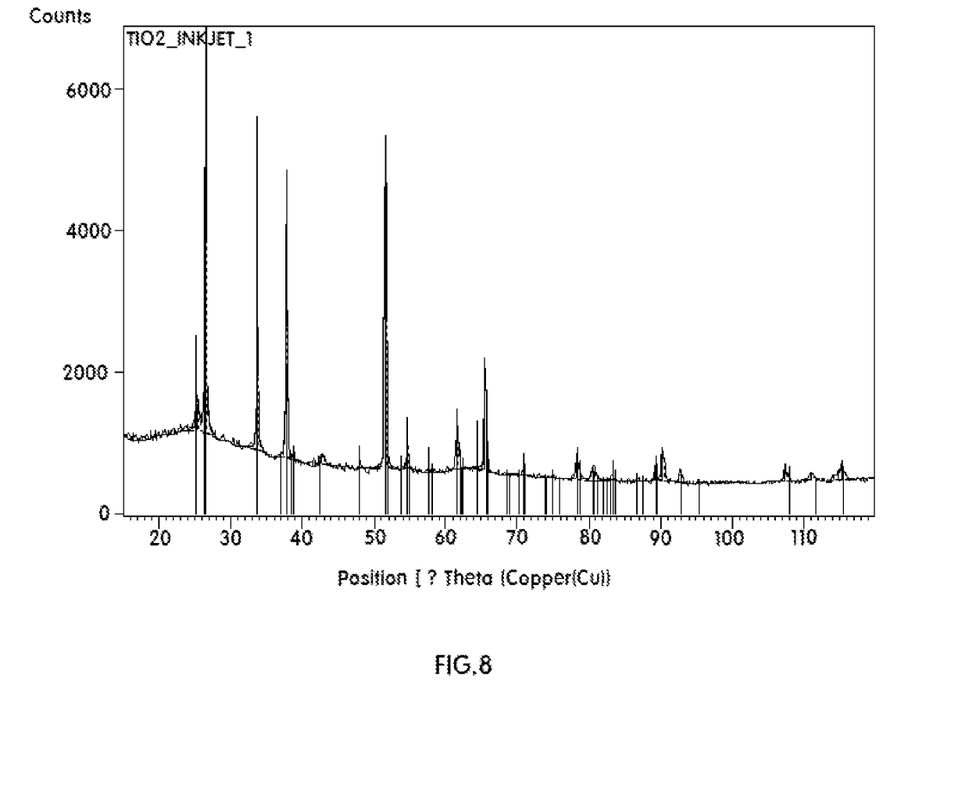
FIG. 8 is a view illustrating XRD data of a $TiO_2$ layer formed according to an embodiment of the present invention.
Figure 9:
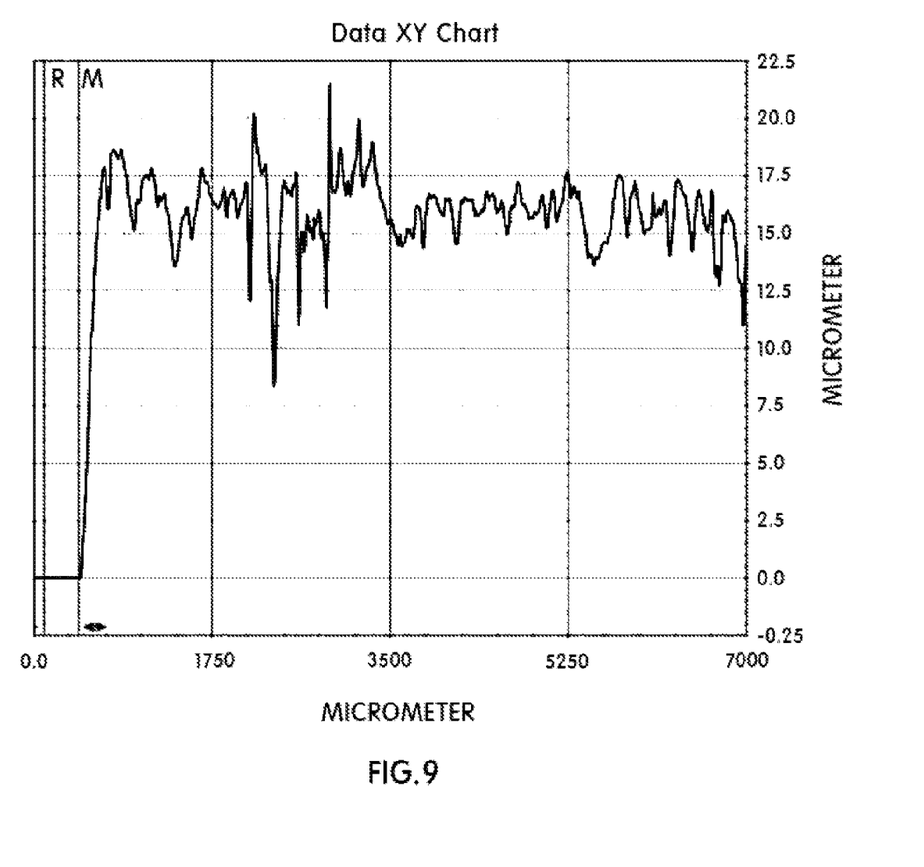
FIG. 9 is a view illustrating a thickness profile of a $TiO_2$ layer formed using an inkjet printing method according to an embodiment of the present invention.

FIGS. 4 and 5 illustrate exemplary inkjet printers.

Referring to FIG. 4, a curved conductive substrate is held by a holder 132 on the support 130 while jetting the semiconductor oxide ink composition on the conductive substrate in the inkjet printing method to form a thick semiconductor oxide layer.

Referring to FIG. 5, a curved conductive substrate is fixed on a support 135 having the same curvature as that of the conductive substrate by vacuum equipment 140 so that the conductive substrate is thereby held while a thick semiconductor oxide layer is coated on the conductive substrate using the inkjet printer.

As shown, the semiconductor oxide ink composition is coated on the conductive substrate through a nozzle 120 of the inkjet printer. The semiconductor oxide ink composition supplied through the nozzle 120 may be kept heated to a predetermined temperature by a transducer 110 driven by a driver 100, for example as shown in FIGS. 4 and 5.

According to an embodiment, the transducer 110 may include a piezo element or a heater.

According to existing screen printing methods, a sintering process is necessarily required after one layer is coated since the coated layer may be otherwise deformed during formation of a subsequent layer. Accordingly, such existing printing methods require repeated sintering processes. However, according to the embodiments of the present invention, the contactless inkjet printing method is used and, thus, requires only one sintering process after all of the layers are coated, thereby saving process time and costs.

After completion of the sintering process, the working electrode is soaked in commercially available dye, such as N-719, so that the dye may be adsorbed onto the surface of the thick $TiO_2$ layer (S14).

Then, the working electrode and the counter electrode are joined to each other using an adhesive, such as Surlyn™, epoxy, glass frit, or UV-curing agent (S15). An electrolyte is then injected in between the electrodes (S16), thus forming a solar cell module.

In some embodiments, when a UV-curing agent is used as the adhesive, a UV curing lamp and a dispenser for jetting the UV-curing agent may be mounted in the inkjet printer so that processing time and cost may be reduced.

As described above, the contactless inkjet printing method according to the embodiments of the present invention allows for reduction in the number of necessary sintering processes and formation of thick layers with a uniform thickness on both planar and curved substrates. Thus, the dye-sensitized solar cell according to the embodiments of the present invention may be applicable to most parts of a vehicle, for example, such as door glass, windshield, and a solar cell sunroof.

Although it has been illustrated in FIG. 3 to employ a parallel-type curved dye-sensitized solar cell, the present invention is not limited thereto. For example, according to other embodiments, any types of solar cell structures, such as a serial-type or monolith-type, may be used.

The process of manufacturing the curved dye-sensitized solar cell according to the embodiments of the present invention will now be summarized.

As described above, the $TiO_2$ ink composition, and the silver and Pt inks are prepared as the semiconductor oxide ink composition and metallic ink composition, respectively.

Then, the conductive substrates for working and counter electrodes are washed and prepared (S10). The $TiO_2$ ink composition and silver ink composition both are jetted on the conductive substrate for working electrode in the inkjet printing method to form the thick $TiO_2$ layer 13 and silver grid 14 (S11), thus forming the working electrode.

In an embodiment, in forming a semiconductor oxide layer on the conductive substrates for the working electrode, the semiconductor oxide may be selected from $TiO_2$, ZnO, $SnO_2$, $Nb_2O_5$ or a mixture thereof. For example, the semiconductor oxide ink prepared by combining $TiO_2$ and $SnO_2$ can be coated on the conductive substrates via ink jet printing.

In an embodiment, a semiconductor oxide layer may be formed by alternatively laminating two or more of semiconductive oxide inks on the conductive substrates. That is, firstly forming a ZnO layer on the conductive substrates, and then forming a $SnO_2$ layer on top of it, and so on, thereby forming a multi-laminated semiconductive oxide layer.

Subsequently, the Pt ink composition is jetted on the conductive substrate for counter electrode in the inkjet printing method (S12) to form the catalyst electrode 23, thus forming the counter electrode.

The $TiO_2$ layer 13, the silver grid 14, and the Pt electrode 23 are together dried and sintered (S13), and the working electrode is soaked in the dye so that the dye may be adsorbed onto the $TiO_2$ layer (S14).

Thereafter, the working and counter electrodes are joined to each other by a suitable adhesive (S15), and the electrolyte 17 is injected therebetween (S16), thus forming the dye-sensitized solar cell.

According to some embodiments, the $TiO_2$ layer 13 may be coated so to a thickness of more than 1 μm. It is further possible to uniformly print the conductive substrate even though it is curved.

Next, the present invention will be described in detail with reference to examples. However, the scope of the present invention is not limited to the following examples.

Example 1

Titanium isopropoxide, water, ethanol, and nitric acid were mixed at a mole ratio of 1:1.5:20:0.08, stirred for 4 hrs, and then dried in a vacuum oven at 60° C. for 12 hrs to thereby remove the solvent.

The resultant material was washed several times by water and ethanol using a filter until pH became neutral, and then dried again in the vacuum oven at 60° C. for 24 hrs.

The $TiO_2$ nano-particles thus acquired were added to ethanol in an amount of 10 wt %, and then a dispersing agent was further added, such as DisperBYK-180, in an amount of 2 wt % with respect to the weight of the $TiO_2$ nano-particles, followed by circulation and dispersion by a wet-type bead mill for 1 hr.

Next, 1 wt % methyl cellulose solution (using a solvent obtained by mixing water and ethanol at a weight ratio of 5:5) was added by 5 wt % relative to the weight of the $TiO_2$, and then dispersed for 20 min using a horn-type ultrasonic homogenizer, followed by being subjected to a 3-roll mill to adjust viscosity to 8 cps.

The thus formed $TiO_2$ ink composition was used to form a $TiO_2$ layer on a curved conductive layer. The resultant $TiO_2$ layer had a thickness of 7 μm.

A transflective dye-sensitized solar cell module with a size of 100 mm×100 mm was also manufactured using the $TiO_2$ ink composition. The resultant photoelectric conversion efficiency was 3.5%.

Example 2

Titanium isopropoxide, water, ethanol, and nitric acid were mixed at a mole ratio of 1:1.5:30:0.05 and stirred for 6 hrs, and then dried in a vacuum oven at 60° C. for 12 hrs to thereby remove the solvent.

The subsequent processes were identical to those of Example 1 except that ethyl cellulose was used as the binder instead of methyl cellulose.

The thus formed $TiO_2$ ink composition was used to form a $TiO_2$ layer on a curved conductive layer. The resultant $TiO_2$ layer had a thickness of 7 μm.

A transflective dye-sensitized solar cell module with a size of 100 mm×100 mm was also manufactured using the $TiO_2$ ink composition. The resultant photoelectric conversion efficiency was 4.5%.

Example 3

A semiconductor oxide sol using the same mole ratio as that in Example 2 was created, and then ethanol was removed using an evaporator.

100 g of the thus formed semiconductor oxide sol was added to a 200 g mixed solvent (a mixture of water and ethanol at a mole ratio of 3:7), followed by addition of 3 g DisperBYK-2001. The thus formed mixture was then circulated and dispersed by a wet-type bead mill for 1 hr.

Thereafter, the solvent was removed by the evaporator and 200 g of 2-methoxyethanol was added to the resultant $TiO_2$ sol.

Subsequently, the resultant material was dispersed by a horn-type ultrasonic homogenizer for 20 min, and then added to 10 g polypropylene glycol acrylate, followed by being subjected to a 3-roll mill to adjust the viscosity to 12 cps.

The thus formed $TiO_2$ ink composition was used to form a $TiO_2$ layer on a curved conductive layer. The resultant $TiO_2$ layer had a thickness of 7 μm, and the photoelectric conversion efficiency of the dye-sensitized solar cell module was 5.2%.

Comparative Example 1

A $TiO_2$ ink composition manufactured by the same method as that of Example 3 was used to form a $TiO_2$ layer on a planar conductive layer. The resultant $TiO_2$ layer had a thickness of 10 μm, and photoelectric conversion efficiency of the dye-sensitized solar cell module was 5.3%.

Comparative Example 2

To manufacture a planar dye-sensitized solar cell module, $TiO_2$ paste (T/SP) was used to form a $TiO_2$ layer having the same thickness as that of Comparative Example 1 in a screen printing method. The resultant planar dye-sensitized solar cell module showed a photoelectric conversion efficiency of 4.5%.

As can be seen from Examples 1 to 3 and Comparative Examples 1 and 2, a curved dye-sensitized solar cell manufactured according to the present invention provides an efficiency equal to or greater than that achieved by existing planar dye-sensitized solar cells.

The curved photoelectric conversion element manufactured according to the present invention may be applied to glass for vehicles, such as door glass, windshields, and sunroofs.

While the invention has been described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

What is claimed is:

1. A semiconductor oxide ink composition for inkjet printing comprising:
   a semiconductor oxide;
   a solvent; and
   a first agent selected from the group consisting of a silane coupling agent, a chelate agent, and a mixture thereof, the first agent comprising about 0.01 to 50 parts by weight relative to 100 parts by weight of the total composition,
   the semiconductor oxide comprising about 0.1 to 20 parts by weight relative to 100 parts by weight of the total composition wherein the viscosity of the ink ranges from about 1 to 30 cp and the surface tension of the ink is about 20 to 70 dynes/cm.

2. The composition of claim 1, wherein the semiconductor oxide is selected from TiO2, ZnO, SnO2, Nb2O5 and mixtures thereof.

3. The composition of claim 1, wherein the solvent is selected from the group consisting of water, methanol, ethanol, n-propyl alcohol, isopropyl alcohol, normal butanol, isobutanol, hexanol, ethylene glycol, glycerol, 2-methoxyethanol, 2-butoxyethanol, 2-ethoxyethanol, nitromethane, ethylacetate, dimethylformamide, methylethylketone, N-methyl-2-pyrolidone, 2-pyrolidone, N-vinyl-2-pyrolidone, dimethylsulfoxide, n-butyrolactone, γ-butyrolactone, α-terpineol, xylene, chloroform, toluene, hexane, cycle hexane, tetrahydrofuran, and acetone, and a mixture thereof.

4. The composition of claim 1, further comprising a second agent selected from the group consisting of ethylene oxide-based compounds, methyl-β-cyclodextrin, cetyltrimethylammonium bromide (CTAB), sodium dodecylsulfonate (SDS), polystyrene sulfonate (PSSA), poly(sodium-4-stylenesulfonate) (PSSNa), dodecylbenzene sulfonate (DBSA), acetylacetone, cellulose-based compounds, and acrylate-based compounds, and a mixture thereof, the second agent comprising about 0.5 to 300 wt % relative to the content of the semiconductor oxide.

5. The composition of claim 1, further comprising a viscosity controlling agent selected from the group consisting of alginic acid, arabic gum, polyvinylalcohol (PVA), curdlan, gelatin, guar gum, glucomannan, locust bean gum, pectin, tamarind gum, xanthan gum, polyvinylpyrrolidone, ethylcellulose, and methylcellulose.

6. The composition of claim 1, wherein an average secondary particle size of the semiconductor oxide is 1 μm or less.

7. A method of manufacturing a photoelectric conversion element comprising:
   providing the semiconductor oxide ink composition of claim 1;
   preparing a metallic ink composition;
   jetting the semiconductor oxide ink composition and the metallic ink composition on a first conductive substrate using an inkjet printing method to form a semiconductor oxide layer and a metallic grid, respectively, thereby forming a working electrode;
   jetting the metallic ink composition on a second conductive substrate using an inkjet printing method to form a catalyst electrode, thereby forming a counter electrode; and
   drying and sintering the semiconductor oxide layer, the metallic grid, and the catalyst electrode.

8. The method of claim 7, wherein the first and second conductive substrates are planar or curved.

9. The method of claim 7, wherein the thickness of the semiconductor oxide layer is 1 μm or greater.

10. The method of claim 7, wherein the semiconductive oxide layer is formed to have a multi-laminated structure by alternative coating of two or more of semiconductive oxide inks on conductive substrates.

11. A method of manufacturing a semiconductor oxide ink composition for inkjet printing comprising combining a semiconductor oxide, a solvent and a first agent selected from the group consisting of a silane coupling agent, a chelate agent, and a mixture thereof, the first agent comprising about 0.01 to 50 parts by weight relative to 100 parts by weight of the total composition, wherein the semiconductor oxide is added at about 0.1 to 20 parts by weight relative to 100 parts by weight of the total composition wherein the viscosity of the ink ranges from about 1 to 30 cp and the surface tension of the ink is about 20 to 70 dynes/cm.

12. The method of claim 11, wherein when the semiconductor oxide is used in the form of a sol, and 0.5 to 90 parts by weight of the semiconductor oxide is added relative to 100 parts by weight of the total composition.

13. The method of claim 11, wherein the semiconductor oxide is selected from TiO2, ZnO, SnO2, Nb2O5 and mixtures thereof.

14. The method of claim 11, wherein a first agent selected from a silane coupling agent, a chelate agent and a mixture thereof, is added to the total composition in an amount of 0.01 to 50 parts by weight relative to 100 parts by weight of the total composition, and wherein the total composition is stirred in an ambient at room temperature to 120° C. for 0.1 to 12 hrs.

15. The method of claim 11, wherein a viscosity controlling agent selected from the group consisting of alginic acid, arabic gum, polyvinylalcohol (PVA), curdlan, gelatin, guar gum, glucomannan, locust bean gum, pectin, and tamarind gum is added to the total composition to adjust the viscosity of the total composition in the range of 1 to 30 cp.

16. The method of claim 11, wherein a second agent selected from the group consisting of an ethylene oxide-based compound or poly ethylene oxide-based compound and a mixed copolymer, with random or alternative arrangement of polyethylene oxide and polypropylene oxide including methyl-β-cyclodextrin, cetyltrimethylammonium bromide (CTAB), sodium dodecylsulfonate (SDS), polystyrene sulfonate (PSSA), poly(sodium-4-stylenesulfonate) (PSSNa), dodecylbenzene sulfonate (DBSA), acetylacetone, cellulose-based compounds, and acrylate-based compounds, and a mixture thereof, is added to the total solution at 0.5 to 300 wt % relative to the content of the semiconductor oxide.

17. The method of claim 11, wherein the total composition is dispersed using a ball mill, a bead mill, or an ultrasonic homogenizer.

* * * * *